United States Patent [19]

Ohkuma et al.

[11] Patent Number: 4,948,694
[45] Date of Patent: Aug. 14, 1990

[54] RECORDING MEDIUM COMPRISING PHOTOPOLYMERS

[75] Inventors: Norio Ohkuma, Machida; Masanori Takenouchi, Atsugi; Masashi Miyagawa, Kawasaki; Hiroshi Hayashi, Ohtsu; Tooru Minami; Hiroharu Oobayashi, both of Kyoto, all of Japan

[73] Assignee: Canon Kabushiki Kaisha, Tokyo, Japan

[21] Appl. No.: 405,585

[22] Filed: Sep. 11, 1989

Related U.S. Application Data

[63] Continuation of Ser. No. 129,488, Dec. 7, 1987, abandoned.

[30] Foreign Application Priority Data

Dec. 9, 1986 [JP] Japan .................................. 61-292683

[51] Int. Cl.$^5$ ........................... G03C 1/68; G03C 1/72
[52] U.S. Cl. ...................................... 430/138; 430/270; 430/281; 430/916; 430/919; 430/924; 428/195; 428/913; 428/914
[58] Field of Search ............... 430/138, 281, 270, 916, 430/919, 924; 428/195, 913, 914

[56] References Cited

U.S. PATENT DOCUMENTS

| | | | |
|---|---|---|---|
| 3,756,827 | 9/1973 | Chang | 430/281 |
| 4,289,844 | 9/1981 | Specht et al. | 430/281 |
| 4,440,846 | 4/1984 | Sanders et al. | 430/138 |
| 4,632,899 | 12/1986 | Takeda | 430/281 |
| 4,675,269 | 6/1987 | Saccocio et al. | 430/138 |
| 4,701,397 | 10/1987 | Rourke et al. | 430/138 |
| 4,713,312 | 12/1987 | Adair et al. | 430/138 |

FOREIGN PATENT DOCUMENTS

| | | | |
|---|---|---|---|
| 0022188 | 1/1981 | European Pat. Off. | 430/281 |
| 0205083 | 12/1986 | European Pat. Off. | 400/120 |

Primary Examiner—Paul R. Michl
Assistant Examiner—Patrick A. Doody
Attorney, Agent, or Firm—Fitzpatrick, Cella, Harper & Scinto

[57] ABSTRACT

A recording medium comprising a substrate and a transfer recording layer containing a photo-initiator comprising camphorquinone and a coumarin derivative. Such photo-initiator aids in realizing high sensitivity without lowering storage stability of the recording medium. The transfer recording layer causes a change in transfer characteristic when provided with light energy and heat energy, at least one of which is applied imagewise, to provide a transferable portion therein. The transferable portion is then transferred to a transfer-receiving medium such as plain paper to form a transferred image thereon.

11 Claims, 5 Drawing Sheets

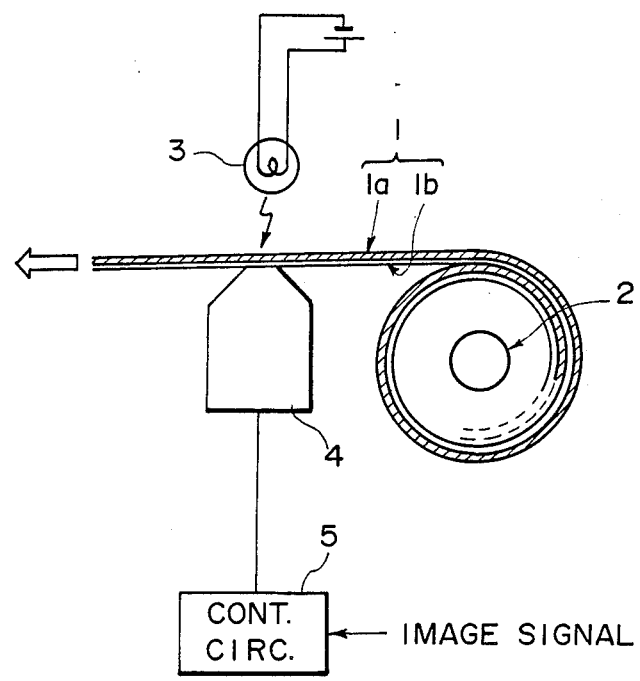
F I G. 2
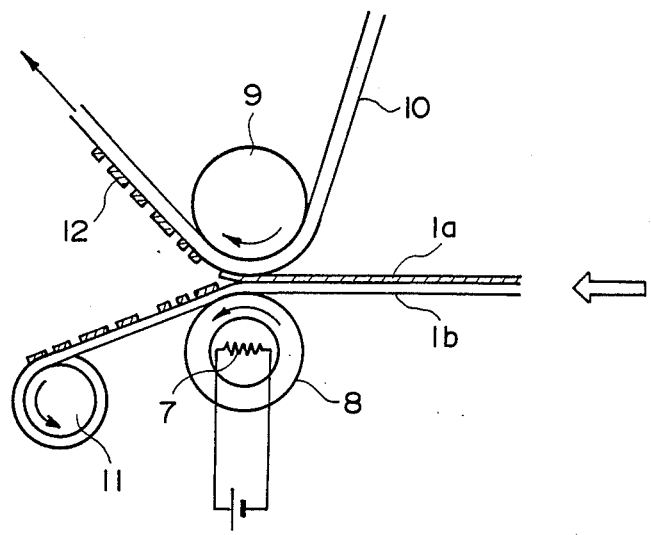
F I G. 3

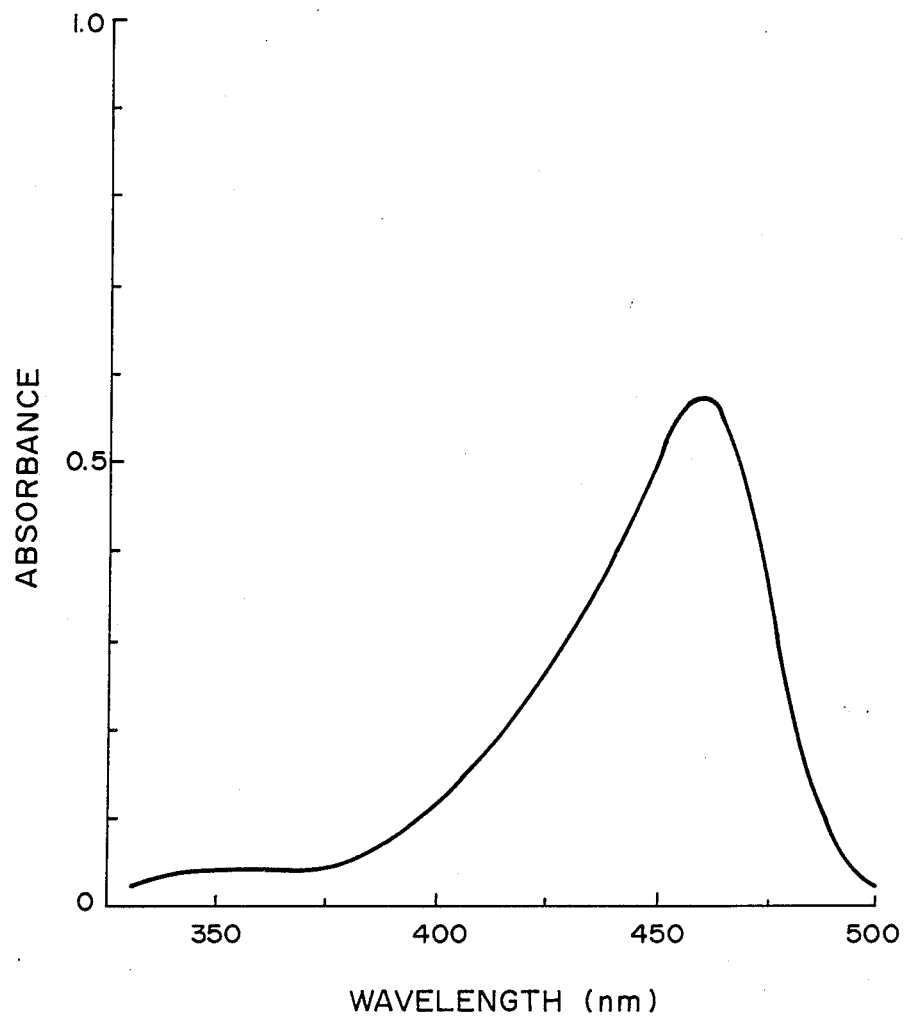
F I G. 5

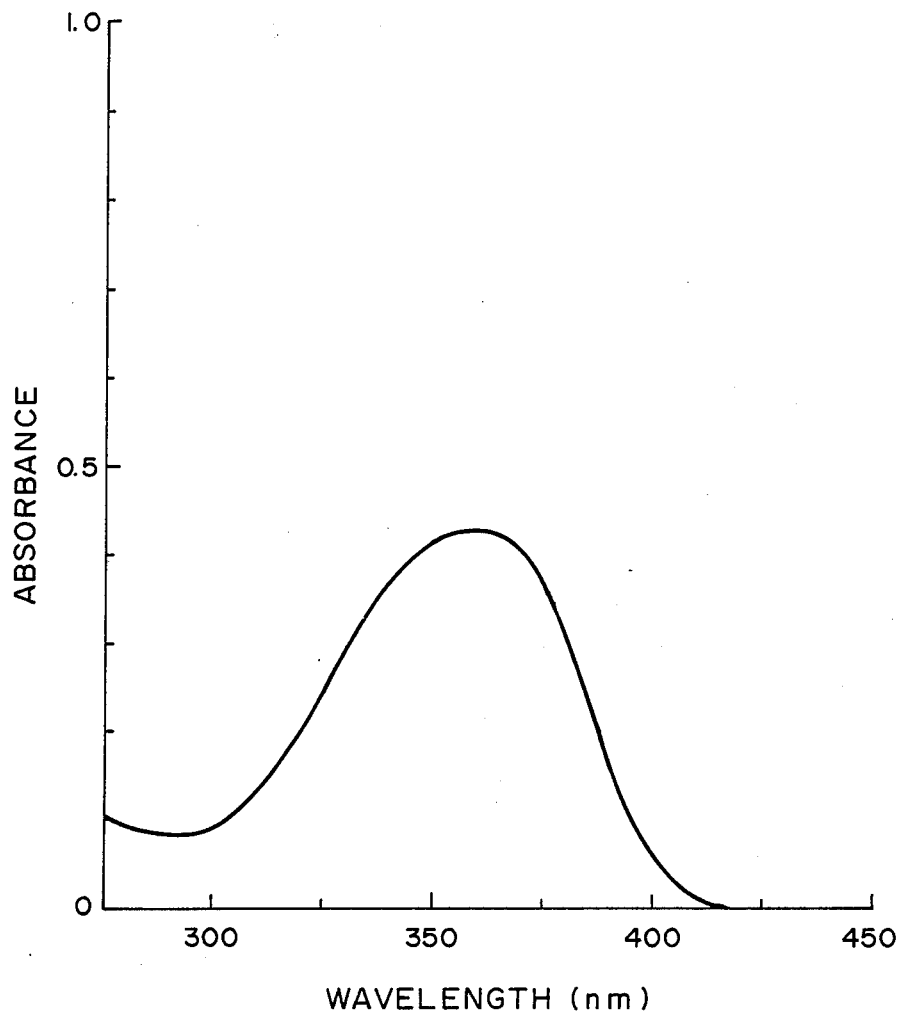
F I G. 6

RECORDING MEDIUM COMPRISING PHOTOPOLYMERS

This application is a continuation of application Ser. No. 129,488 filed Dec. 7, 1987 now abandoned.

FIELD OF THE INVENTION AND RELATED ART

The present invention relates to a novel recording medium applicable for printers, copying machines, and facsimile machines, particularly to a recording medium used in a recording method suitable for a one-shot color recording.

In recent years, various information processing systems have been developed, and various recording methods and apparatus have been developed corresponding to the respective information processing systems. One such recording method, the thermal or heat-sensitive transfer recording method, has advantages in that the apparatus employed is light weight, compact, free of noise, excellent in operability and adapted to easy maintenance, and accordingly has been recently widely used. According to this method, plain paper can be used as a transfer-receiving medium or a medium to be transfer-printed.

However, the thermal transfer recording method of the prior art is not free from drawbacks. That is, according to the heat-sensitive transfer recording method of the prior art, the transfer recording performance, namely the printed letter quality, is strongly influenced by the surface smoothness of the transfer-receiving medium and therefore while good printing can be effected on a transfer-receiving medium having high smoothness, the printed letter quality will be markedly lower in the case of a transfer-receiving medium with low smoothness. Although paper, which is the most typical transfer-receiving medium, may be used problems are present. A paper with high smoothness is rare while ordinary paper has surface unevenness to various degrees because is formed through entanglements of fibers. As a result, according to the conventional thermal transfer recording method, the resulting printed image on paper may not be sharp at the edge portion or a part of the image may be missing thus lowering the printed letter quality.

Further, in the conventional thermal transfer recording method, while the transfer of an ink layer to the transfer-receiving medium is caused by only the heat supplied from a thermal head, it is difficult even from a theoretical point of view to increase the heat supply from the thermal head. That is a problem because it is required to cool the thermal head to a prescribed temperature in a limited short time and it is also are necessary to prevent occurrence of thermal crosstalk between heat-generation segments or elements constituting the thermal head face. For this reason, high speed recording has been difficult to realize according to the conventional thermal transfer recording method.

Further, as heat conduction has a slow response speed compared with electricity or light, it has been generally difficult to control a heat pulse sufficient to reproduce a medium tone by conventional recording systems using a thermal head, and also it has been impossible to effect a medium tone recording as the conventional thermal transfer ink layer lacks a transfer function for gradational representation.

Further, in the conventional thermal transfer recording method, it has been only possible to obtain one image color through one transfer operation, and accordingly, it has been necessary to repeat the transfer step several times to superpose colors in order to obtain a multi-color image. Since it is very difficult to exactly superpose images of different colors, it has been difficult to obtain an image free of color deviation or aberration. Particularly, when one picture element is involved, superposition of colors has not been effected in such a one picture element, and consequently, a multi-color image has been constituted by assembly or gathering of picture elements involving color deviation in the conventional thermal transfer recording method. For this reason, it has been impossible to obtain a clear multi-color image according to the conventional thermal transfer recording method.

Further, when it is desired a multi-color image by the conventional thermal transfer recording methods, there have been attended difficulties such as provision of plural thermal heads or complex movements involving reversals of direction and stopping of transfer-receiving media which requires a large and complex apparatus or a decrease in recording speed.

There has been proposed a transfer imaging method for producing a multi-color image by using a color precursor (chromogenic material) and a developer (U.S. Pat. No. 4,399,209). More specifically, in this method, an imaging sheet comprising a substrate and a coating thereon comprising a chromogenic material and a radiation-curable composition encapsulated in rupturable capsules, is provided; the coating is subjected to imagewise exposure with actinic radiation to cure the radiation-curable composition and form a latent image and the latent image is superposed onto a developer sheet comprising a developer layer to form a visible image on the developer sheet.

Further, U.S. Pat. No. 4,416,966 discloses a self-contained image-forming system wherein an image-forming sheet comprising photosensitive microcapsules and a developer both disposed on the same substrate surface is used. In this system, the image-forming sheet is exposed mainly to ultraviolet rays exchanged corresponding to an image to be recorded, and then it is passed through pressing rollers so that the microcapsules are raptured and the internal phase thereof is ejected imagewise. Concurrently, a chromogenic material migrates to the developer ordinarily disposed in another layer and the chromogenic material reacts there with to form a multi-color image.

In the two recording methods as mentioned above, only light energy is used to forming a latent image on a transfer recording medium (image sheet), so that a recording medium highly sensitive to light or a light flux of a high energy is required in order to obtain a clear image at a high speed. A high sensitivity recording medium generally has a poor storage stability and is therefore not appropriate for easy handling. Further, it is difficult to obtain the high energy required for curing a radiation-curable composition at a high speed with a single kind of energy, particularly light energy, thus a large apparatus has been generally required.

Further, the above recording method has a disadvantage that the stability of recorded images is essentially poor because the color thereof is developed by using color production of a leuco-dye.

Furthermore, in the above method, the internal phase of the microcapsules is required to be a photo-sensitive composition containing a liquid phase at normal temperature, in order to facilitate the development by use of pressure after the exposure. Therefore the internal phase or the microcapsules are poor in storage stability. Further, the obtained images have the odor of a remaining monomer because the unreacted microcapsules are ruptured, whereby the images have practically undesirable characteristics.

In order to solve the above mentioned problems, an image forming method has been proposed. (U.S. patent application Ser. No. 869,689 corr. to Japanese Patent Application No. 128814/1986).

These applications basically disclose an image forming method, comprising:

providing a transfer recording medium comprising a transfer recording layer, the transfer recording layer being capable of causing an irreversible change in transfer characteristic thereof when provided with plural kinds of energies;

imparting the plural kinds of energies to the transfer recording layer under such a condition that at least one of the plural kinds of energies corresponds to a recording information signal, thereby to form a transferable portion in the transfer recording layer; and transferring the transferable portion of the transfer recording layer to a transfer-receiving medium, thereby to leave an image corresponding to the transferable portion on the transfer-receiving medium.

Further, it has been proposed, a recording method wherein the above-mentioned recording method of U.S. patent application Ser. No. 869,689 is improved in fixing (U.S. patent application Ser. No. 927,876), and a recording method wherein a vaporizable dye is applied to the above recording method (U.S. patent application Ser. No. 070,194).

SUMMARY OF THE INVENTION

It is therefore a principal object of the present invention to provide a recording medium which has solved the above-mentioned problems accompanying the conventional thermal transfer recording method.

A specific object of the present invention is to provide a recording medium which can be suitably used in an image forming method which provides a transfer image of high quality and affords a high speed recording and a medium tone recording.

A still further object of the present invention is to provide a recording medium excellent in sensitivity and storage stability which can be suitably used in an image forming method which affords a multi-color transfer image without requiring a complicated movement of a transfer-receiving medium.

Another object of the present invention is to provide a recording medium capable of providing a clear transfer image on plain paper without a particular developer layer, which has a low surface smoothness and is a most popular transfer-receiving medium.

According to the present invention, there is provided a recording medium comprising a substrate and a transfer recording layer disposed thereon capable of changing its transfer characteristic when provided with light energy and heat energy; wherein the transfer recording layer is solid at room temperature and comprises at least a colorant and a functional component sensitive to the provision of light energy and heat energy; the functional component comprises at least a photo-initiator and a polymerizing component of a monomer, oligomer or prepolymer having an unsaturated double bond; and the photo-initiator comprises a coumarin derivative and camphorquinone.

These and other objects, features and advantages of the present invention will become more apparent upon a consideration of the following description of the preferred embodiments of the present invention taken in conjunction with the accompanying drawings, wherein like parts are denoted by like reference numerals.

BRIEF DESCRIPTION OF THE DRAWINGS

FIGS. 2 and 3 are respectively a schematic side view showing an example of a system arrangement for practicing a transfer recording method using the recording medium according to the present invention;

FIGS. 5 and 6 are graphs showing the absorption characteristics of a sensitizer for use in the recording medium according to the present invention.

DETAILED DESCRIPTION OF THE INVENTION

Figure 1A:
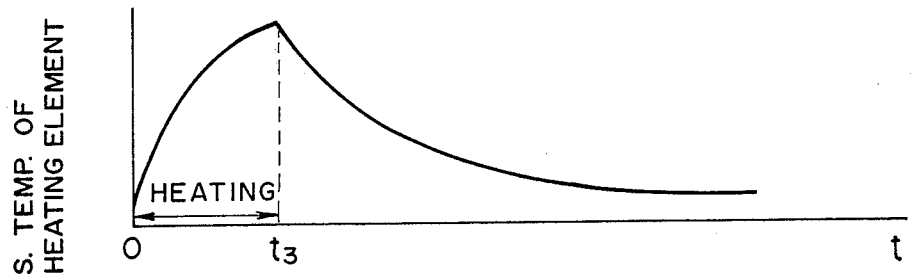
FIGS. 1A–1D are graphs illustrating the principle of a transfer recording method using the recording medium according to the present invention.

The recording medium according to the present invention comprises a substrate and a transfer recording layer disposed thereon. The transfer recording layer contains a functional or sensitive component sensitive to the provision of light energy and heat energy, and the transfer recording layer is so constituted as to change its transfer characteristic or transferability when provided with light energy and heat energy.

In a case where a transfer recording is effected by using the recording medium according to the present invention, as more specifically described hereinbelow, light energy and heat energy are imparted to the transfer recording layer under such a condition that at least one of the light energy and heat energy corresponds to a recording information signal, to change its transfer characteristic, whereby a transferable portion or transferable image is formed in the transfer recording layer. Then, the transferable portion of the transfer recording layer is transferred to a transfer-receiving medium, e.g., by using heat and pressure.

In the above transfer recording method, the transferable portion may be formed by changing a physical property controlling a transfer characteristic. The physical property controlling a transfer characteristic may be determined depending on a particular type of recording medium used. For example, with respect to a recording medium used in a transfer mode wherein transfer of an image is effected through heat-fusion of the image, the physical property may be a melting temperature, a softening temperature, a glass transition temperature, etc. With respect to a recording medium used in a transfer mode wherein transfer of image is effected by making an image to be transferred viscous or penetrable into a transfer-receiving medium, the physical property may be a viscosity at the relevant temperature.

Therefore, the functional component used in the recording medium of the present invention comprises, at least, a photo-initiator, and a polymerizing component which can be polymerized or crosslinked.

In the present invention, the polymerizing component comprises a monomer, oligomer or prepolymer having an unsaturated double bond (i.e., an ethylenic double bond). The monomer, oligomer or prepolymer may be used singly or as a mixture of two or more species. Further, in the recording medium of the present invention, there is used a multi-component initiator comprising camphorquinone and at least one species of a compound selected from coumarin derivatives, as the photo-initiator.

Incidentally, e.g., U.S. Pat. No. 4,147,552 or Japanese Patent Publication No. 42684/1984, etc., have disclosed that a coumarin derivative functions as a photo-initiator. However, in such a case a light source of high energy must be used, because the photopolymerization-initiating property coumarin derivative alone is not sufficient.

However, the multi-component photo-initiator used in the present invention, when used in a mixture with a polymerizable compound having an unsaturated double bond, remarkably increases the photopolymerization velocity of the above compound. Particularly, the photo-initiator according to the present invention has high sensitivity when provided with heat energy.

In a case where the transfer recording layer containing the functional component is solid as in the present invention, the reaction velocity of the functional component largely depends on the diffusion velocity of the photo-initiator. Particularly, when the photo-initiator comprises a multi-component system and the synergistic effect of the components is considerable, the dependence of the reaction velocity on the diffusion velocity of the photo-initiator is further increased.

Particularly, in a case where the photo-initiator comprises a combination of camphorquinone and at least one species of compound selected from coumarin derivatives, as in the present invention, it is supposed that the polymerization-initiating function is based on the following mechanism: the coumarin derivative having a strong light-absorbing characteristic efficiently absorbs light and reaches an excited state; and then it cleaves the largely strained bond between two carbonyl groups of the camphorquinone which have been fixed in a cis-form by the intramolecular bicyclo-ring, on the basis of an interaction such as energy transfer or one-electron transfer to the camphorquinone, whereby a radical is produced.

In the above-mentioned photo-initiator according to the present invention, the synergistic effect of the camphorquinone and the coumarin derivative is extremely marked, and the above-mentioned dependence of the reaction velocity on the diffusion velocity of the photo-initiator is further increased. Particularly, when the mobility (or diffusion velocity) of the coumarin derivative and the camphorquinone in the solid transfer recording layer is increased by imparting heat energy these are associated and the probability of producing the radical is increased due to the interaction therebetween. As a result, the contrast between the portion supplied with the energy and the portion not supplied with the energy can be pronounced.

The coumarin derivative typically used in the present invention may include compounds represented by the following general formula (I) described in Japanese Patent Publication No. 42684/1984:

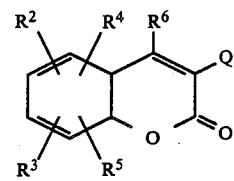

In the above formula (I), Q denotes —CN, a substituted or unsubstituted heterocyclic group wherein the number of the carbon and hetero atoms constituting the ring is 5–15, or Z—$R^1$ group Herein, $R^1$ denotes a substituted or unsubstituted alkyl, alkenyl, alkoxy, or alkylthio group having 1–10 carbon atoms; a substituted or unsubstituted aryl group having 6–12 carbon atoms; a substituted or unsubstituted aryloxy group having 6–12 carbon atoms; or a substituted or unsubstituted heterocyclic group wherein the number of the carbon and hetero atoms constituting the ring is 5–15, or a hydroxyl group; and Z denotes a carbonyl, sulfonyl, sulfinyl, or arylenedicarbonyl group.

$R^2$, $R^3$, $R^4$ and $R^5$, respectively, independently denote hydrogen, a substituted or unsubstituted alkoxy group having 1–6 carbon atoms, a substituted or unsubstituted alkenyloxy group having 1–6 carbon atoms, a substituted or unsubstituted alkylthio group having 1–6 carbon atoms, a dialkylamino group wherein each alkyl group has 1–4 carbon atoms, a hydroxyl group, an acyloxy group, halogen, nitro group, or 5- or 6-membered heterocyclic group. Alternatively, two or three atoms of $R^2$ or $R^5$, in combination with a carbon atom constituting the ring which is connected to the above $R^2$ or $R^5$, form a condensed ring or a condensed ring system wherein each condensed ring is 5- or 6-membered ring.

$R^6$ denotes hydrogen, a substituted or unsubstituted alkyl group having 1–4 carbon atoms, or a substituted or unsubstituted aryl group having 6–12 carbon atoms.

In addition, 7-di-lower alkylamino-4-lower alkyl-coumarin, etc., described in Japanese Laid-Open Patent Application No. 84183/1973 (JP-A 48-84183) may also be used. However, the coumarin derivative according to the present invention is not restricted to the above-mentioned compounds.

When the coumarin derivative represented by the general formula (I) is used in combination with camphorquinone, the sensitivity is remarkably enhanced as compared with the coumarin derivative alone.

Among these coumarin derivatives represented by the general formula (I), in view of the sensitivity, there may be preferably used those having a carbonyl group in the 3-position and having, in the 7-position, a electron-donating group represented by a dialkyl amino group, a piperidino group, a morpholino group, a pyrrolidine group, an alkoxy group, a hydroxyl group, an acetoxy group, a benzoyloxy group capable of having a substituent, etc.

Specific examples of such coumarin derivative may include the following compounds: 3-benzoyl-5,7-dimethoxycoumarin, 3-benzoyl-7-methoxycoumarin, 3-benzoyl-6-methoxycoumarin, 3-benzoyl-8-ethoxycoumarin, 7-methoxy-3-(p-nitrobenzoyl)coumarin, 3-benzoylcoumarin, 3-(p-nitrobenzoyl)coumarin, 3-benzoylbenzo[f]coumarin, 3,3'-carbonylbis(7-methoxycoumarin), 3-acetyl-7-methoxycoumarin, 3-benzoyl-6-bromocoumarin, 3,3'-carbonylbiscoumarin, 3-benzoyl- 7-dimethylaminocoumarin, 3,3'-carbonylbis(7-diethylaminocoumarin), 3-carboxycoumarin, 3-carboxy-7-methoxycoumarin, 3-ethoxy-carbonyl-6-methoxycoumarin, 3-ethoxycarbonyl-7-methoxycoumarin, 3-acetylbenzo[f]coumarin, 3-acetyl-7-methoxycoumarin, 3-(1-adamantoyl)-7-methoxycoumarin, 3-benzoyl-7-hydroxycoumarin, 3-benzoyl-6-nitrocoumarin, 3-benzoyl-7-diethylaminocoumarin, 7-dimethylamino-3-(4-iodobenzoyl)coumarin, 7-diethylamino-3-(4-iodobenzoyl)coumarin, 7-diethylamino-3-(4-dimethylaminobenzoyl)coumarin, 7-methoxy-3-(4-methoxybenzoyl)coumarin, 3-(4-nitrobenzoyl)benzo[f]coumarin, 3-(4-ethoxycinnamoyl)-7-methoxycoumarin, 3-(4-dimethylaminocinnamoyl)coumarin, 3-(4-diphenylaminocinnamoyl)coumarin, 3-[(3-methylbenzothiazole-2-ilidene)acetyl]coumarin, 3-[(1-methylnaphtho[1,2-d]thiazole-2ilidene)acetyl]-coumarin, 3,3'-carbonylbis(6-methoxycoumarin), 3,3'-carbonylbis(7-acetoxycoumarin), 3,3'-carbonylbis(7-dimethylaminocoumarin), 3,3'-carbonylbis(5,7-diisopropoxy)coumarin, 3,3'-carbonylbis(5,7-di-n-propoxy)coumarin, 3,3-carbonylbis(5,7-di-n-butoxy)coumarin, 3-cyano-6-methoxycoumarin, 3-cyano-7-methoxycoumarin, 7-methoxy-3-phenylsulfonylcoumarin, 7-methoxy-3-phenylsulfinylcoumarin, 1,4-bis(7-diethylamino-3-coumarylcarbonyl)-benzene, 7-diethylamino-5,7'-dimethoxy-3,3'-carbonylbiscoumarin, 7-dimethylamino-3-thenoylcoumarin, 7-diethylamino-3-furoylcoumarin, 7-diethylamino-3-thenoylcoumarin, 3-benzoyl-7-(1-pyrrolidinyl)coumarin, 5,7,6'-trimethoxy-3,3'-carbonylbiscoumarin, 5,5,7'-trimethoxy-3,3'-carbonylbiscoumarin, 7-diethylamino-6'-methoxy-3,3'-carbonylbiscoumarin, 3-nicotinoyl-7-methoxycoumarin, 3-(2-benzofuroylcarbonyl)-7-methoxycoumarin, 3-(7-methoxy-3-coumarinoyl)-1-methylpyrimidium fluorosulfate, 3-(5,7-diethoxy-3-coumarinoyl)-1-methylpyrimidium fluoroborate, N-(7-methoxy-3-coumarinoylmethyl)pyridinium bromide, 9-(7-diethylamino-3-coumarinoyl)-1,2,4,5-tetrahydro-3H,6H,10H[1]-benzopyrano[9,9a,1-gh]quinolazine-10-one, 3-(2'-benzthiazolyl)-7-diethylaminocoumarin, 4-methyl-7-diethylaminocoumarin, 7-diethylaminocyclopenta[c]-coumarin, 9-methyljulolidino[9,10-c]-11H-pyran-11-one, etc.

The above-mentioned coumarin derivatives may be synthesized in a manner as disclosed in the above-mentioned U.S. Pat. No. 4,147,552, Japanese Patent Publication No. 42684/1984 (JP-B 59-42684), etc.

In the photo-initiator according to the present invention, a preferred weight ratio of the components is (coumarin derivative):(camphorquinone) =about 30:1 to about 1:30, more preferably about 10:1 to about 1:10, particularly preferably about 5:1 to about 1:3.

Further, the sensitivity may be further improved by adding an amine to the photo-initiator according to the present invention. Particularly, when the coumarin derivative has no amino group, the above effect becomes pronounced. The amine may preferably be used in a weight ratio of about 1:10 to about 10:1, more preferably about 1:5 to about 5:1, based on the photo-initiator.

Examples of the above amine, used in combination may include those as follows: aromatic amines such as ethyl p-dimethylaminobenzoate, methyl p-dimethylaminobenzoate, isoamyl p-dimethylaminobenzoate, phenyl p-dimethylaminobenzoate, ethyl p-diethylaminobenzoate, phenyl p-diethylaminobenzoate, N,N-dimethylaniline, N,N-diethylaniline, N,N-dimethylbenzylamine, N-benzyl-N-methylaniline, N,N-dibenzylaniline and triphenylamine; aliphatic amines such as trimethylamine, triethylamine, tripropylamine, dimethylcyclohexylamine and triethanolamine; polyamines such as methylenediamine, hexamethylenediamine, 1,4-cyclohexanediamine and phenylenediamine; etc. These amines may be used as a mixture of two or more species.

However, the amine used in the present invention is not restricted to the above-mentioned amines.

Hereinbelow, there will be described a preferred embodiment of the image forming method using the recording medium according to the present invention.

For comprehension of such image forming method, an example of using a recording medium for which a transferable image is formed by light and heat energies is explained with reference to FIGS. 1A to 1D, wherein the abscissas are indicated on a common scale of time.

Figure 1B:
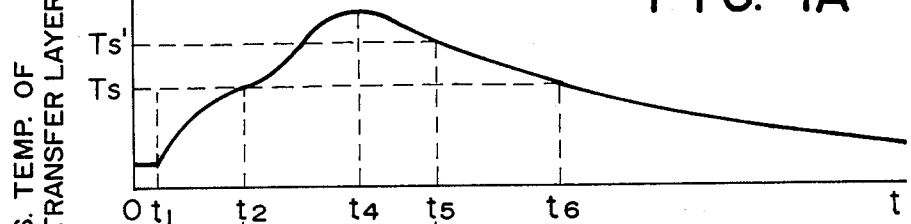

FIG. 1A shows a surface temperature change of a heating element when a heating means such as a thermal head is energized for heat generation for a period of $0-t_3$ and subjected to temperature decrease thereafter. A transfer recording medium contacting the heating means under pressure caused a temperature change as shown in FIG. 1B corresponding to the temperature change of the heating means. More specifically, it starts to cause a temperature rise after a time delay of $t_1$ and similarly reaches the maximum temperature at time $t_4$ after time $t_3$, then followed by temperature decrease.

Hereinbelow, the image forming method will be explained by using a softening temperature.

The transfer recording layer has a softening temperature Ts and abruptly softens to decrease its viscosity in a temperature region above Ts. The change in viscosity is shown by a curve A in FIG. 1C. Thus, after the temperature reaches Ts at time $t_2$ and until it reaches the maximum temperature at time $t_4$, the viscosity continually decreases, while the viscosity again increases thereafter along the temperature decrease to show an abrupt increase in viscosity until time $t_6$ when the temperature decreases to Ts. In this case, the transfer recording layer has not been basically subjected to any material change and shows a decrease in viscosity in the manner as described above when it is heated above Ts in a subsequent transfer step.

Accordingly, if the transfer recording layer is caused to contact a transfer-receiving medium under pressure and subjected to heating required for transfer, e.g., to a temperature above Ts, the transfer recording layer is transferred in the same transfer mechanism as involved in the conventional thermal transfer recording. In this invention, however, when the transfer recording layer is illuminated or exposed to light from $t_2$ in parallel with heating as shown in FIG. 1D, and the temperature is sufficiently increased, the transfer recording layer softens and the photo-initiator is actuated to provide a large reaction velocity, and the polymerizing component rapidly causes curing or hardening, because the probability of polymerization (or crosslinking) of the polymerizing component is rapidly increased.

Figure 1C:
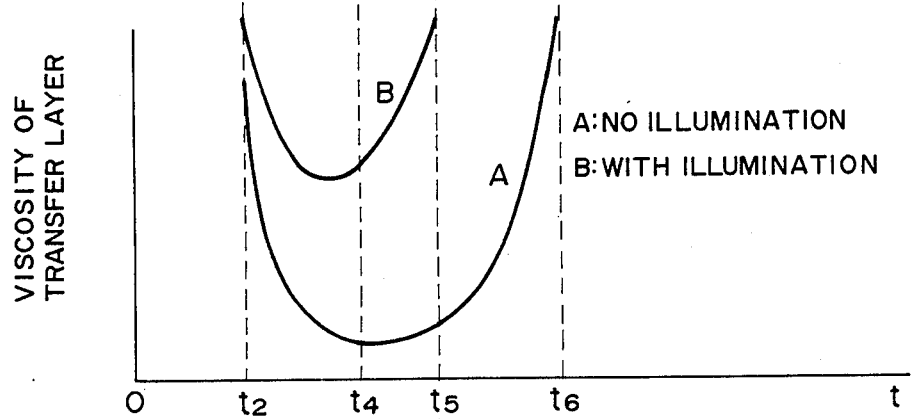
Figure 1D:
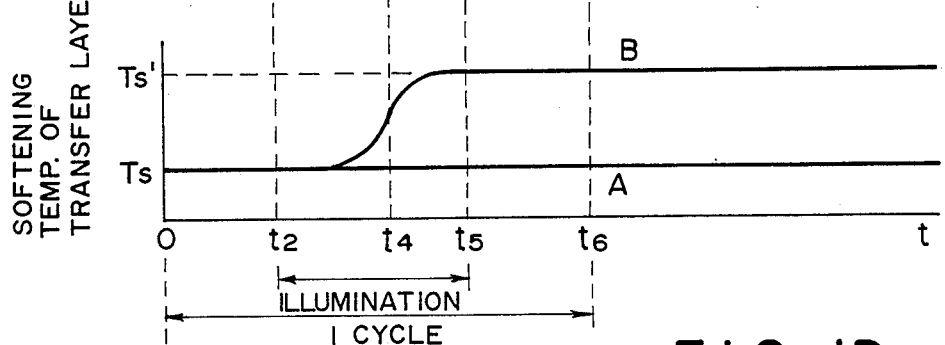

In this way, if heating and illumination are simultaneously carried out, the transfer recording layer shows a viscosity change as represented by a curve B in FIG. 1C. Then, along with further progress of reaction, the softening temperature is raised from Ts to Ts' at time $t_5$ when the curing is completed. The change in softening temperature as described above of the transfer recording layer is illustrated in FIG. 1D. Corresponding to this, the transfer recording layer is caused to have a different transfer initiation temperature, i.e., a temperature at which it starts to be transferred, from Ta to Ta'. As a result, the transfer recording layer has a portion having a transfer initiation temperature Ta' and also a portion retaining a transfer initiation temperature Ta which behave differently in a subsequent transfer step.

Now, when the transfer recording layer is heated, e.g., to a temperature Tr satisfying Ta<Tr<Ta', the portion having a transfer initiation temperature Ta preferentially causes an abrupt decrease in viscosity to be selectively transferred to a transfer-receiving medium. In this instance, Ta'−Ta (or Ts'−Ts) should preferably be about 20° C. or more, more preferably 40° C. or more while it somewhat depends on temperature stabilization accuracy during the transfer step. Such a temperature difference is the same in the case of Ts>Ts'. In this way, a transferable image may be formed by controlling heating or non-heating in combination with simultaneous illumination, corresponding to an image signal.

The physical property controlling the transfer characteristic of a transfer recording layer may also be represented by another physical property such as a melting temperature, a glass transition temperature, etc., instead of the transfer initiation temperature or softening temperature as described above. In any case, a transferable image may be formed in a transfer recording layer by utilizing an irreversible change in melting temperature, glass transition temperature, etc. As the melting temperature and glass transition temperature change with a similar tendency as a softening temperature, the change in melting temperature or glass transition temperature may be similarly utilized in the same manner as described above with respect to the softening temperature.

The transfer initiation temperature mentioned herein is a value measured by the following method.

A 6 μ-thick transfer recording layer formed on a 6 μ-thick polyethylene terephthalate (PET) film is caused to contact 0.2 mm-thick wood-free paper as a transfer-receiving medium having a surface smoothness (Bekk smoothness) of 50–200 seconds. The resultant laminate of the transfer recording medium and the paper is passed at a rate of 2.5 mm/sec between a pair of rollers as follows. The first roller is a hollow cylindrical iron roller of 40 mm diameter in which a 300 W-halogen lamp heater is stored and is disposed on the side of the transfer recording medium. The second roller disposed on the side of the paper comprises a similar iron roller of 40 mm diameter coated with a 0.5 mm-thick fluorine rubber layer. The two rollers are operated to exert a linear pressure of 4 kg/cm. In the measurement, the surface temperature of the first roller is measured by a temperature sensor, e.g., a thermistor, while controlling the halogen lamp heater to provide a prescribed temperature. At a time of 4 seconds after the laminate is passed through the two rollers, the transfer recording medium is peeled off the paper moved horizontally at a peeling angle of about 90° and at a rate equal to the conveying speed of the rollers, so that it is observed whether the transfer recording layer has been transferred onto the paper. The operation is continued while gradually raising the surface temperature of the first roller (at a rate of 10° C./min or less), and the minimum temperature at which the transfer starts to occur effectively (as identified by saturation of a transferred image density) is identified as the transfer initiation temperature of the transfer recording medium or the transfer recording layer.

As described above, the change in the transfer characteristic may be represented by a change in glass transition temperature Tg, softening temperature Ts or melting temperature Tm of the transfer recording layer or transfer recording medium. In order to obtain a recorded image in the subsequent transfer step, it is sufficient that the viscosity or penetrability of the transfer recording medium of the present invention changes. Even when the above-mentioned Tg, Ts or Tm does not change clearly, the transfer recording medium of the present invention is applicable.

Further, the light energy and heat energy may be imparted to the transfer recording medium simultaneously or separately.

With respect to the amount of the photo-initiator (i.e., a coumarin derivative+camphorquinone) contained in the functional component of the recording medium according to the present invention, the weight ratio of the photo-initiator to a compound having an unsaturated double bond (i.e., a polymerizing component having an ethylenic unsaturated double bond) may preferably be in a range of about 1:5 to about 1:1000, more preferably about 1:10 to about 1:100.

A monomer, oligomer or prepolymer having an unsaturated double bond used in the recording medium of the present invention, may include: urethane acrylates or urethane methacrylates having a urethane bond synthesized by a polyaddition reaction of a polyisocyanate (optionally reacted with a polyol, as desired) with an alcohol or amine having an unsaturated double bond; epoxyacrylates synthesized by an addition reaction of an epoxy resin with acrylic acid or methacrylic acid; polyester acrylates, spiacrylates, or polyether acrylates. The monomer, oligomer or prepolymer used in the present invention, however, is not restricted to these compounds.

Further, in the present invention, there may be used a prepolymer comprising a skeleton of polyalkylene, polyether, polyester or polyurethane as a main chain, to which a polymerizing or crosslinking reactive group represented by an acrylic group, a methacrylic group, a cinnamoyl group, a cinnamylideneacetyl group, a furylacryloyl group or a cinnamic acid ester group, is introduced as a side chain. The prepolymer used in the present invention is not restricted to these compounds.

The above-mentioned monomer, oligomer or prepolymer may preferably be solid at normal temperature or room temperature. Further, the above monomer, oligomer or prepolymer having an unsaturated double bond, and the photo-initiator may be used in combination with a binder component.

As the binder component, known organic polymers may be used. Examples of such organic polymer may include: polymers obtained by addition polymerization such as methacrylic acid copolymers, acrylic acid copolymers, itaconic acid copolymers, partially esterified maleic acid copolymers, maleic acid copolymers, etc.; chlorinated polyolefins such as chlorinated polyethylene and chlorinated polypropylene; polymethyl methacrylate, polyacrylic acid, polymethacrylic acid, polyacrylic acid alkyl esters, copolymers comprising an acrylic acid alkyl ester and acrylonitrile, vinyl chloride, vinylidene chloride, styrene or butadiene, etc.; polyvinyl chloride, copolymers of vinyl chloride and acrylonitrile, polyvinylidene chloride, copolymers of vinylidene chloride and acrylonitrile, polyvinyl acetate, copolymers of vinyl acetate and vinyl chloride, polyvinyl alcohol, polyvinyl pyrrolidone, polyacrylonitrile, copolymers of acrylonitrile and styrene, copolymers of acrylonitrile and butadiene and styrene, polyvinyl alkyl ether, polymethyl vinyl ketone, polyethyl vinyl ketone, polyethylene, polypropylene, polystyrene, polyamide, polybutadiene, polyisoprene, polyurethane, polyethylene terephthalate, chlorinated rubber, polychloroprene, styrene-butadiene copolymers; etc.

Among these polymers, there may preferably be used chlorinated polyethylene, polymethyl methacrylate, polyvinyl chloride, vinylidene chloride-acrylonitrile copolymers, polystyrene, styrene-acrylic copolymers, polyvinyl butyral, polyvinyl acetate, vinyl chloride-vinyl acetate copolymers, chlorinated rubber, etc.

These binder components may be used singly or as a mixture of two or more species. The binder content may be 0–90 wt. %, preferably 1–60 wt. %, based on the functional component.

Further, waxes may be used as the binder component without considering the compatibility or incompatibility thereof.

Examples of such wax may include: vegetable waxes such as candelilla wax, carnauba wax and rice wax, animal waxes such as beeswax and whale wax, mineral waxes such as ceresine wax and montan wax, petroleum waxes such as paraffin wax; and synthetic waxes including polyethylene wax, sasol wax, montan wax derivatives, paraffin wax derivatives, hardened castor oil, hardened castor oil derivatives, fatty acids such as stearic acid, fatty acid amides, fatty acid esters. These waxes may be used singly or as a mixture of two or more species.

The coloring component or colorant is a component to provide an optically recognizable image and may be appropriately selected from various pigments and dyes. Specific examples of the colorant include: inorganic pigments such as carbon black, lead yellow, molybdenum red and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

The colorant content may preferably be 0.1–30 wt. parts, based on the weight of the functional component and the binder component. Further, in the present invention, the transfer recording layer may further comprise an optional additive such as a thermal polymerization inhibitor or a plasticizer.

The above-mentioned functional component may be in the form of a continuous layer obtained by dissolving it in a solvent and applying the resultant coating liquid onto a substrate or support. Alternatively, the functional component may be in the form of a particulate image forming element or a microencapsulated particulate image forming element, which may be applied onto a substrate. The substrate used in the present invention may be selected from films of polyethylene terephthalate, polyamide, etc.

An optional layer may be formed on the surface of the substrate. Examples of such optional layer may include another applied layer for facilitating the combination of a transfer recording layer and a substrate, or a layer for preventing halation, an ultraviolet ray-absorbing layer or a visible ray-absorbing layer.

The recording medium of the present invention applicable to multi-color recording may preferably be prepared in the following manner.

First, there is prepared a composition comprising a colorant and a coumarin derivative. Plural kinds of such compositions are respectively prepared by using plural kinds of colorants, and plural kinds of coumarin derivatives which respectively have sensitivities to mutually different wavelength regions corresponding to the colors of the above-mentioned colorants, or a coumarin derivative and a known photo-initiator respectively having sensitivities to mutually different wavelength regions. Then, the above-mentioned plural kinds of compositions are respectively microencapsulated and are randomly carried on a substrate film, whereby a recording medium corresponding to multi-color recording is obtained.

By use of the thus prepared recording medium, a multi-color recording may be effected by imparting plural kinds of energies to the recording medium under such a condition that the plural kinds of energies include light having wavelengths corresponding to the wavelength regions to which the respective photo-initiators have sensitivities and that at least one of the plural kinds of energies corresponds to a recording information image signal.

When the image forming elements constituting the transfer recording layer is provided in the form of microcapsules, the core of the capsules may be formed of the above-mentioned materials for the transfer recording layer. The core is prepared in the form of a solid.

On the other hand, the wall of the microcapsules may for example be formed of a material including: gelatine, gelatine-gum arabic, sodium alginate, polyvinyl alcohol, cellulosic resins such as ethyl cellulose and nitrocellulose, urea-formalin resin, resorcinol-formaldehyde resin, urea-formaldehyde resin, isocyanate-polyol resin, melamine-formaldehyde resin, hydroxypropylcellulose, polyvinyl chloride, polyvinyl chloride-cellulose, acetate butyrate, polyvinyl acetate, polystyrene, polyethylene, polymethyl methacrylate, polyamide, styrene-acrylonitrile copolymer, vinylidene chloride-acrylonitrile copolymer, epoxy resin, polyvinyl formal, vinyl chloride-vinyl acetate copolymer, polyester, polyacrylic acid ester, butyl acetate cellulose, polyvinyl pyrrolidone, polyvinylidene chloride, nylon, tetoron, polyurethane, polycarbonate, maleic anhydride-type copolymer, polyethylene terephthalate, etc.

In the recording medium according to the present invention, the transfer recording layer may z preferably have a thickness of 1–20 $\mu$m, more preferably 3–10 $\mu$m. In a case where the transfer recording layer comprises the image forming elements, which may be in the form of microcapsules, the image forming elements may preferably have a particle size of 1–20 $\mu$m, more preferably 3–10 $\mu$m. Further, the particle sizes of the image forming elements may preferably be distributed in the range of ±50% or less, particularly ±20% or less, on the basis of the number-average particle size thereof. In a case where the image forming element is in the form of a microcapsule, the wall material thereof may preferably have a thickness of 0.1–2.0 $\mu$, more preferably 0.1–0.5 $\mu$m.

Known methods may be used as a process for preparing the microcapsular image forming element. For example, there may be used simple coacervation method, complex coacervation method, interfacial polymerization method, in-situ polymerization method, interfacial precipitation method, phase-separation method, spray-drying method, air-suspension encapsulation method, mechanochemical method, etc.

In order to bond or bind the image forming element to the substrate, there may be used a binder for application such as polyvinyl alcohol (PVA), an epoxy-type adhesive, polyvinyl pyrrolidone, polyacrylamide, polyester-type resin, urethane-type resin, acrylic-type resin, urethane-acrylic type resin, ethylene-vinyl acetate copolymer resin, etc. The thickness of the binder for application may preferably be 0.1-1 μm.

In the recording medium of the present invention, it is possible that the radical reactivity of the transfer recording layer is suppressed because of oxygen in the air. In order to obviate this difficulty, it is preferred to provide an oxygen-shielding layer by applying an aqueous polyvinyl alcohol solution containing a small amount of a surfactant on the transfer recording layer. The oxygen-shielding layer may be removed after the transferable image formation by washing with water. In case of image forming elements in the form of microcapsules, it is possible to have the walls show a function of the oxygen-shielding layer.

The recording medium of the present invention may for example be produced in the following manner.

The various components forming the transfer recording layer such as a functional component, stabilizer, colorant, etc., may be melt-mixed and applied on a substrate by means of an applicator, etc., to form a recording medium according to the present invention.

In a case where the transfer recording layer is formed of image forming elements, for example, the above components may be mixed and formed into minute image forming elements by spray-drying, etc., for respective colors, and the resultant image forming elements of respective colors are bonded by the medium of a binder or adhesive onto a substrate such as a polyimide film to obtain a desired recording medium.

In a case where the image forming elements are in the form of microcapsules, they are produced in a manner as described in Example hereinbelow and may be bonded to a substrate similarly as described above with reference to the particulate image forming elements.

Alternatively, the image forming elements may be attached to a substrate electrostatically. In this case, one of or both of the particulate image forming element and the substrate may be corona-charged or triboelectrically charged, and they may be attached to each other.

In the present invention, the image forming elements may be carried on a substrate by using a physical method or a chemical method. In the physical method, the above-mentioned binder or adhesive, or static electricity may be used. On the other hand, in the chemical method, a functional group may be introduced to the respective surfaces of the image forming element and the substrate contacting each other, and these may be chemically bonded.

The substrate or support to be used in the recording medium according to the present invention may be polyester, polycarbonate, triacetylcellulose, nylon, polyimide, polyethylene terephthalate, or metal such as aluminum, etc., in the form of, e.g., a film or sheet, plate, drum, or sphere.

Hereinbelow, the present invention will be described by way of Examples.

EXAMPLE 1

Since a coumarin derivative may have various absorption wavelengths, fluorescent lamps having the following characteristics were used as a light source.

Light Source A: peak wavelength of 335 nm (FL10A 70E35, mfd. by Toshiba K.K.)

Light Source B: peak wavelength of 390 nm (FL10A 70E39, mfd. by Toshiba K.K.)

Light Source C: peak wavelength of 450 nm (FL10A70B, mfd. by Toshiba K.K.)

TABLE 1

| Item | Component | wt. % |
|---|---|---|
| Polymerizing component | tris(2-methacryloxyethyl)-isocyanurate (FA-731M, mfd. by Hitachi Kasei K. K.) | 57 |
| Binder component | PMMA (Elvasite 2041, mfd. by Du Pont) | 33 |
| Coumarin derivative | 3,3'-carbonylbis)7-dimethyl-aminocoumarin) | 1 |
| | camphorquinone | 1 |
| Colorant | Carbon black | 8 |

The components shown in Table 1 were dissolved in a solvent of dichloromethane, and the resultant coating liquid was applied onto a 6 μm-thick polyethylene terephthalate film to form a 4 μm-thick transfer recording layer. Then, an aqueous solution of polyvinyl alcohol (Mw=1200) was applied onto the thus formed transfer recording layer to form a 10 μm-thick oxygen-shielding layer, whereby a recording medium was obtained.

The thus prepared recording medium was wound up in a roll and set to a feed roller 2 in an apparatus as shown in FIG. 2.

The thermal head 4 was a line-type one of 8 dots/mm—A4 size having a heating element row at its edge portion. The heating element row was so disposed that it might contact the substrate 1b side of the transfer recording medium 1 under a pressure based on the tension of the transfer recording medium 1.

On the other hand, in the side of the transfer recording layer 1a, opposite to the thermal head 4, a chemical lamp (radiation peak: 450 nm, FL10A 70B mfd. by Toshiba K.K.) 3 was disposed.

The heating elements of the thermal head 4 were energized under control by a control circuit 5 based on image signals. In this embodiment, the transfer recording layer 1a had such a property that the transfer initiation temperature increased when provided with light and heat through increase in softening temperature thereof, so that a negative type of recording was effected. Thus, the thermal head 4 was not energized in response to a mark signal (black) but was energized in response to a non-mark signal (white) to generate heat at a current energy of 0.8 W/dot×2.0 msec.

In the above described manner, while effecting uniform illumination by using the chemical lamp, the thermal head 4 was energized under control based on image signals, while the transfer recording medium 1 was conveyed by a stepping motor and a driving rubber roller (not shown) in synchronism with the operation in a repetition cycle of 7 msec/line.

After a transferable image was formed in this way, the polyvinyl alcohol film was removed by washing with water, and plain paper 10 with a surface smoothness of 10-30 sec was superposed onto the transfer recording layer 1a of the transfer medium 1. The resultant laminate was conveyed through a heat roller 8 and a pinch roller 9. The heat roller 8 was an aluminum roller having a 300 W-heater 7 inside thereof and covered with 2 mm-thick silicone rubber layer. The surface temperature of the heat roller 8 could be controlled at a desired temperature in the range of 50°-150° C. by the heater. The pinch roller 9 was made of a silicone rubber having a hardness of 50° according to a JIS rubber hardness meter and controlled to exert a pressure of 1–1.5 kg/cm².

Thus, the transfer recording medium 1 was superposed onto the plain paper 10 so that the transfer recording layer 1a contacted the paper 10, and the resultant laminate was conveyed while the surface temperature of the heat roller 8 was controlled at 90°–150° C. Thereafter, the substrate film 1b was peeled from the paper 10 whereby a transferred image 12 of high quality having a good fixation characteristic could be formed on the paper 10. Then, the transfer recording medium 1 was wound about a windup roller 11.

EXAMPLES 2–6

Transfer recording media according to the present invention were prepared in the same manner as in Example 1, except that the following compounds were respectively used as the coumarin derivative in the composition shown in Table 1.

By using the thus prepared transfer recording media, recording was effected under the same conditions as in Example 1, whereby transferred images of high quality having a good fixation characteristic could be formed.

COUMARIN DERIVATIVES USED IN EXAMPLES 2–6

Example 2: 9,9′carbonylbis(1,2,4,5-tetrahydro-3H,6H,10H[1]benzopyrano[9,9a,1-gh]quinolazine-10-one), Example 3: 9-(7-diethylamino-3-coumarinoyl)-1,2,4,5-tetrahydro-3H,6H,10H[1]benzopyrano9,9a,1-gh]-quinolazine-10-one, Example 4: 3 (2′-benzthiazolyl)-7-diethylaminocoumarin, Example 5: 10-acetyljulolidino9,10-c]-11H-pyran-11-one, and Example 6: 10-cyanojulolidino[9,10-c]-11H-pyran-11-one.

COMPARATIVE EXAMPLE 1

A transfer recording medium was prepared in the same manner as in Example 1 except that the camphorquinone was omitted from the composition shown in Table 1.

By using the thus prepared transfer recording medium, image formation was effected similarly as in Example 1.

As a result, under the following conditions, there could be obtained an image which was barely recognizable.

current energy of thermal head: 1.0 W/dot×50 msec,
repetition cycle: 120 msec, and
heat roller temperature: 90°–100° C.

As will be clearly understood from the above-mentioned result, when the courmarin derivative is singly used as a photo-initiator, the sensitivity is extremely lowered and the image contrast deteriorates, as compared with the case wherein it is used in combination with camphorquinone.

EXAMPLE 7

TABLE 2

| Item | Component | wt. % |
|---|---|---|
| Polymerizing component | product of addition reaction of p-cyclohexyldiisocyanate with 2-hydroxypropyl acrylate (mole ratio = 1:2) | 67 |
| Binder component | chlorinated rubber | 20 |
| Coumarin derivative | 3,3′-carbonylbis(7-methoxycoumarin) | 1.5 |
| | Camphorquinone | 1.5 |
| Amine | phenyl p-dimethylaminobenzoate | 1 |
| Colorant | carbon black | 10 |

A transfer recording medium was prepared in the same manner as in Example 1 except that the components shown in Table 2 were used.

By using the thus prepared transfer recording medium, image formation was effected in the same manner as in Example 1 except that the following imaging conditions were employed and that a chemical lamp B having an radiation peak of 390 nm (FL10A 70E39, mfd. by Toshiba K.K.) was used as the light source 3 corresponding to the absorption wavelength of the coumarin derivative.

current energy of thermal head: 0.8 W/dot×3.0 msec,
repetition cycle: 10 msec, and
heat roller temperature: 110°–150° C.

As a result, a transferred image of high quality having a good fixation characteristic could be formed similarly as in Example 1.

EXAMPLES 8–14

Transfer recording media according to the present invention were prepared in the same manner as in Example 7 except that the following compounds shown in Table 3 were respectively used as the coumarin derivative in the composition shown in Table 2.

By using the thus prepared transfer recording media, image formation was effected under the same conditions as in Example 1, except that the following imaging conditions shown in Table 3 were respectively employed, whereby transferred images of high quality having a good fixation characteristic could be formed.

TABLE 3

| Example | Coumarin derivative | Minimum current energy | Repetition cycle (msec) |
|---|---|---|---|
| 8 | 5,7-dimethyl-3,3′-carbonylbiscoumarin) | 0.8 W/dot × 3 msec | 10 |
| 9 | 3,3′-carbonylbis(5,7-dimethoxycoumarin) | 0.8 W/dot × 4 msec | 10 |
| 10 | 3,3′-carbonylbis(7-acetoxycoumarin) | 0.8 W/dot × 7 msec | 15 |
| 11 | 3-benzoyl-5,7-dimethoxycoumarin | 0.8 W/dot × 5 msec | 10 |
| 12 | 3-benzoly-6-methoxycoumarin | 0.8 W/dot × 10 msec | 20 |
| 13 | 7-dimethylamino-4-methylcoumarin | 0.8 W/dot × 25 msec | 50 |
| 14 | 7-dimethylamino-4-trifluoromethylcoumarin | 0.8 W/dot × 20 msec | 50 |

COMPARATIVE EXAMPLE 2

A transfer recording medium was prepared in the same manner as in Example 7 except that the camphorquinone was omitted from the composition shown in Table 2.

By using the thus prepared transfer recording medium image formation was effected similarly as in Example 7.

As a result, under the following conditions, there could be obtained an image.

current energy of thermal head: 0.8W/dot×10msec, repetition cycle: 20 msec.

When compared with Example 7, the energy required for forming an image was about three times, and the recording speed (corresponding to the repetition cycle) was ½.

EXAMPLE 15

A multi-color image was formed by using the recording medium according to the present invention.

Figure 4:
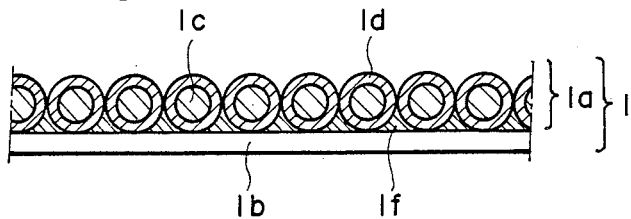
FIG. 4 is a schematic sectional view showing an embodiment of the recording medium according to the present invention.

In this example, a transfer recording layer 1a comprised a plurality of microcapsular image forming elements wherein a core 1c was coated with a shell 1d as shown in FIG. 4.

The components shown in Table 4 were mixed to prepare a core material, which was then microencapsulated in the following manner to form a microcapsular image forming element.

TABLE 4

| Item | Component | wt. % |
| --- | --- | --- |
| Polymerizing component | product of addition reaction of 4,4'-dicyclohexylmethanediisocyanate (Desmodur W, mfd. by Sumitomo-Bayer Urethane K.K.) with 2-hydroxyethylacrylate (mole ratio = 1:2) | 68 |
| Binder component | PMMA (Elvasite 2041, mfd. by Du Pont) | 23 |
| Coumarin derivative | 3,3'-carbonylbis(7-diethylamino-coumarin) | 1.5 |
| | camphorquinone | 1.5 |
| Amine | ethyl p-dimethylaminobenzoate | 1 |
| Colorant | Sumiton Carmine B (mfd. by Sumitomo Kagaku Kogyo K.K.) | 5 |

TABLE 5

| Item | Component | wt. % |
| --- | --- | --- |
| Polymerizing component | product of addition reaction of 4,4'-dicylohexyl methanediisocyanate (Desmodur W, mfd. by Sumitomo-Bayer Urethane K.K. with 2-hydroxyethylacrylate (mole ratio = 1:2) | 68 |
| Binder component | PMMA (Elvasite 2041, mfd. by Du Pont) | 22 |
| Coumarine derivative | 3-benzoyl-5,7-dimethoxycoumarin | 2 |
| | camphorquinone | 1.5 |
| Amine | ethyl p-dimethylaminobenzoate | 1.5 |
| Coloarnt | Lionel Blue FG-7330 (mfd. by Toyo Ink Seizo K.K.) | 5 |

10 g of a mixture of components shown in Table 4 was mixed with 20 g of methylene chloride. THe resultant mixture was further mixed with a solution obtained by dissolving a cationic or nonionic surfactant having an HLB of at least 10 and 1 g of gelatine in 200 ml of water, and the mixture was further emulsified by means of a homomixer at 8,000–10,000 rpm, on heating at 60° C., thereby to obtain oil droplets having an average particle size of 26 microns. The mixture was further stirred for 30 min. at 60° C., and then the methylene chloride was distilled off thereby to obtain oil droplets having an average particle size of 10 microns.

Then, a solution obtained by dissolving 1 g of gum arabic in 20 ml of water was added to the above-prepared mixture. A 10 % NH$_4$OH (aqueous ammonia solution) was added to the resultant mixture, while cooled slowly, to adjust the pH to 11 or higher, whereby a microcapsule slurry was prepared. Thereafter, 1.0 ml of a 20 % aqueous gluraraldehyde solution was slowly added to the slurry thereby to harden the microcapsule walls.

The slurry was subjected to solid-liquid separation by means of a Nutsche funnel, and the solid was dried at 35° C. for 10 hours in a vacuum drier to obtain microcapsular image forming elements.

Separately, microcapsular image forming elements were prepared in the same manner as described above except for using the components shown in Table 5.

Each of the thus prepared two species of image forming elements had a particle size of 7–15 μm and an average particle size of 10 μm.

Separately, an aqueous PVA solution to which a surfactant had been added in an amount of several drops per 100 cc of the solution was applied onto a substrate of a 6 μm-thick polyethylene terephthalate film so that a 0.5 μm-thick adhesive layer 1f might be formed after drying. Thereafter, the above-mentioned two species of image forming elements were sufficiently mixed and distributed on the adhesive layer in closest packing whereby a recording medium 1 was prepared.

The coumarin derivative in the image forming element corresponding to Table 4 had an absorption characteristic as shown in FIG. 5 and showed a magenta color in a transferred image. On the other hand, the coumarine derivative in the image forming element corresponding to Table 5 has an absorption characteristic as shown in FIG. 6 and showed a blue color in a transferred image.

Then, the thus prepared transfer recording medium 1 was wound up in a roll and set in an apparatus as shown in FIG. 2. Incidentally, as a light source 3, there were disposed two lamps of Lamp C having a radiation peak of 450 nm (FL10A 70B, mfd. by Toshiba K.K.), and Lamp A having a radiation peak of 335 nm (FL10A 70E35, mfd. by Toshiba K.K.) corresponding to the coumarin derivatives having the above-mentioned absorption characteristics.

Figure 7:
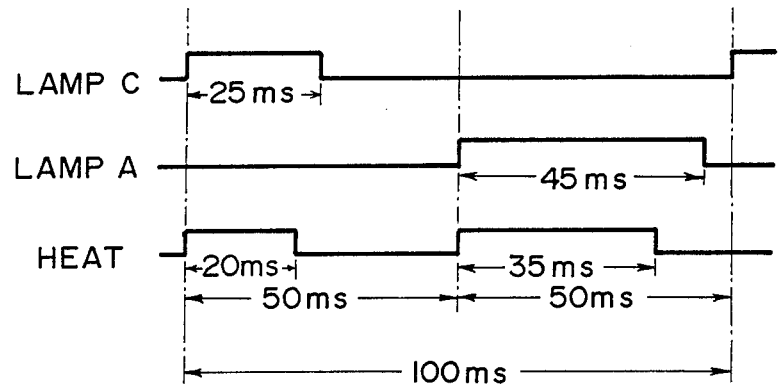
FIGS. 7 and 8 are respectively a timing chart for driving the heat and light energy sources used in an embodiment of the recording method using the recording medium according to the present invention.

In this embodiment, the transfer recording layer 1a had such a property that transferability to transfer-receiving paper was reduced when provided with heat and light having a prescribed wavelength through increase in softening temperature thereof. Therefore, when magenta-color recording was effected, as shown in a driving timing chart of FIG. 7, a current was first supplied for 20 msec not to heating elements of the heating element row of the thermal head corresponding to an image signal of a "magenta", but to those corresponding to an image signal of "white" (in the case of a white transfer-receiving medium), while the Lamp C was simultaneously turned on to effect uniform illumination. The illumination time was 25 msec.

Then, with respect to blue-color recording, after 25 msec from the termination of the illumination (i.e., after 50 msec from the initiation of the current supply), a current was supplied for 35 msec not to heating elements of the heating element row corresponding to an image signal of "blue" but to heating elements corresponding to an image signal of "white", while the Lamp A was simultaneously turned on to effect uniform illumination. The illumination time was 45 msec.

In the above-described manner, the thermal head 4 was energized under control based on image signals of blue, magenta and white, thereby to form a negative-type transferable image in the transfer recording layer 1a, while the transfer recording medium 1 was conveyed in synchronism with the above operation in a repetition cycle of 100 msec/line.

Then, similarly as in Example 1, plain paper was superposed onto the transfer recording layer 1a of the transfer medium 1, and the resultant laminate was pressed and heated whereby a two-color image comprising blue and magenta colors could be transferred onto the plain paper.

In the above-described manner, two-color recording could be effected at one-shot.

EXAMPLE 16

Two species of microcapsules were prepared in the same manner as in Example 15, except that the coumarin derivative in Table 4 was replaced by 3-(2'-benzthiazolyl)-7-diethylaminocoumarin and that three components of the coumarin derivative, camphorquinone and amine in Table 5 were replaced by a known photo-initiator, Quantacure PDD (mfd. by Ward Blenkinsop Co.).

By using the thus prepared microcapsules, a transfer recording medium was prepared in the same manner as in Example 15.

Figure 8:
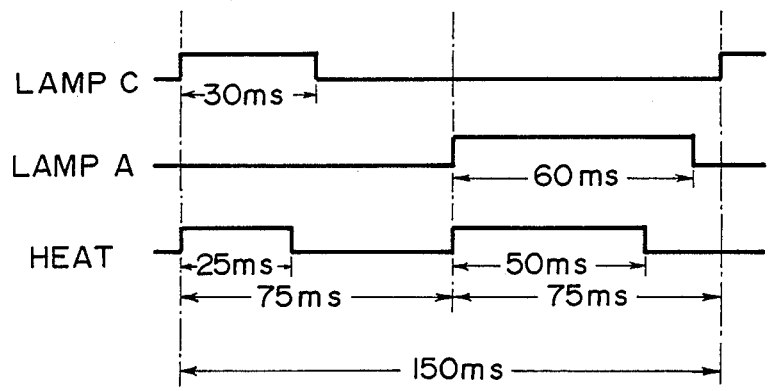

Then, by using the above-prepared transfer recording medium and plain paper, recording was effected in the same manner as in Example 15 except that the above-mentioned Lamp C was used corresponding to the microcapsule containing 3-(2'-benzthiazolyl)-7-diethylaminocoumarin, and the above-mentioned Lamp A was used corresponding to the microcapsule containing Quantacure PDD, and that light and heat were imparted under the conditions as shown in a driving timing chart of FIG. 8.

As a result, a two-color image comprising blue and magenta colors could be obtained.

As described above, two-color recording could be effected at one-shot even by using the photo-initiator according to the present invention in combination with a photo-initiator known in the prior art.

As described hereinabove, since the recording medium according to the present invention comprises camphorquinone and at least one species of compound selected from coumarin derivatives, as a photo-initiator, the recording medium has considerably high sensitivity to energy imparted thereto and provides a clear recorded image.

Further, in an embodiment wherein the transfer recording layer comprises a plurality of particulate image forming elements, transfer recording is effected by attaching respective solid image forming elements to a transfer-receiving medium, whereby a clear recorded image without fog is formed even on plain paper with low surface smoothness which is generally used.

Furthermore, since a transferable image is not formed until light energy and heat energy are simultaneously imparted to the recording medium of the present invention, both of high sensitivity in recording and storage stability can be simultaneously satisfied.

What is claimed is:

1. A recording medium comprising a substrate and a transfer layer disposed thereon capable of irreversibly changing its transfer characteristic when simultaneously provided with light energy and heat energy wherein the transfer recording layer is solid at room temperature and comprises at least a colorant and a functional component sensitive to the provision of light energy and heat energy; the functional component comprises at least a photo-initiator and a polymerizing component of a monomer, oligomer or prepolymer having an unsaturated double bond; and the photo-initiator comprises a coumarin derivative and camphorquinone.

2. A recording medium according to claim 1, wherein said photo-initiator further comprises an amine.

3. A recording medium according to claim 1, wherein said coumarin derivative is represented by the following general formula (I):

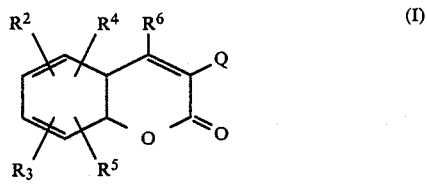

wherein Q denotes —CN, a substituted or unsubstituted heterocyclic group wherein the number of the carbon and hetero atoms constituting the ring is 5–15, or Z—$R^1$ group (wherein $R^1$ denotes a substituted or unsubstituted alkyl, alkenyl, alkoxy, or alkylthio group having 1–10 carbon atoms, a substituted or unsubstituted aryl group having 6–12 carbon atoms; a substituted or unsubstituted aryloxy group having 6–12 carbon atoms, or a substituted or unsubstituted heterocyclic group wherein the number of the carbon and hetero atoms constituting the ring is 5–15, or a hydroxyl group; and Z denotes a carbonyl, sulfonyl, sulfinyl, or arylenedicarbonyl group); $R^2$, $R^3$, $R^4$ and $R^5$, respectively, independently denote hydrogen, a substituted or unsubstituted alkoxy group having 1–6 carbon atoms, a substituted or unsubstituted alkenyloxy group having 1–6 carbon atoms, a substituted or unsubstituted alkylthio group having 1–6 carbon atoms, a dialkylamino group wherein each alkyl group has 1–4 carbon atoms, a hydroxyl group, an acyloxy group, halogen, nitro group, or 5- or 6-membered heterocyclic group; or two or three atoms of $R^2$ or $R^5$, in combination with a carbon atom constituting the ring connected to the above $R^2$ or $R^5$, form a condensed ring or a condensed ring system wherein each condensed ring is 5- or 6-membered ring; and $R^6$ denotes hydrogen, a substituted or unsubstituted alkyl group having 1–4 carbon atoms, or a substituted or unsubstituted aryl group having 6–12 carbon atoms.

4. A recording medium according to claim 3, wherein the coumarin derivative has a carbonyl group at the 3-position and an electron-donating group at the 7-position.

5. A recording medium according to claim 1, wherein the weight ratio of said coumarin derivative to camphorquinone is 30:1 to 1:30.

6. A recording medium according to claim 5, wherein the weight ratio of said coumarin derivative to camphorquinone is 10:1 to 1:10.

7. A recording medium according to claim 6, wherein the weight ratio of said coumarin derivative to camphorquinone is 5:1 to 1:3.

8. A recording medium according to claim 1, wherein said transfer recording layer comprises a plurality of particulate image forming elements.

9. A recording medium according to claim 8, wherein said image forming element comprises a microcapsule having a solid core.

10. A recording medium comprising a substrate and a transfer layer disposed thereon capable of irreversibly changing its transfer characteristic when simultaneously provided with light energy and heat energy wherein the transfer recording layer comprises image forming elements which are solid at room temperature and comprises at least plural kinds of colorants and a functional component sensitive to the provision of light energy and heat energy; the functional component comprises at least an initiator component and a polymerizing component of a monomer, oligomer or prepolymer having an unsaturated double bond; the initiator component comprises plural kinds of photo-initiators having mutually different sensitive wavelength regions corresponding to the plural kinds of colorants; and at least one kind of said photo-initiators comprises a coumarin derivative and camphorquinone.

11. A recording medium according to claim 10, wherein said image forming element comprises a microcapsule having a solid core.

* * * * *

UNITED STATES PATENT AND TRADEMARK OFFICE
CERTIFICATE OF CORRECTION

PATENT NO. : 4,948,694
DATED : August 14, 1990
INVENTOR(S) : NORIO OHKUMA, ET AL.

It is certified that error appears in the above-identified patent and that said Letters Patent is hereby corrected as shown below:

COLUMN 1

Line 21, "light weight," should read --lightweight,--.
    Line 38, "used" should read --used,--.
    Line 55, "are" should be deleted.

COLUMN 2

Line 20, "attended" should read --attendant--.
    Line 45, "raptured" should read --ruptured--.
    Line 49, "there with" should read --therewith--.
    Line 52, "forming" should read --form--.

COLUMN 5

Line 16, "case a" should read --case, a--.
    Line 18, "property coumarin" should read --property of the coumarin--.

COLUMN 6

Line 13, "group Herein," should read --group. Herein,--.
    Line 54, "a" should read --an--.

COLUMN 7

Line 17, "2ilidene)" should read --2-ilidene)--.

UNITED STATES PATENT AND TRADEMARK OFFICE
CERTIFICATE OF CORRECTION

PATENT NO. : 4,948,694
DATED : August 14, 1990
INVENTOR(S) : NORIO OHKUMA, ET AL.

Page 2 of 3

It is certified that error appears in the above-identified patent and that said Letters Patent is hereby corrected as shown below:

COLUMN 12

Line 45, "z" should be deleted.

COLUMN 13

Line 36, "Example" should read --Example 15--.

COLUMN 14

TABLE 1, "3,3'-carbonylbis)7-dimethyl-" should read
    --3,3'-carbonylbis (7-dimethyl- --.

COLUMN 15

Line 31, "benzopyrano9,9a,1-" should read
    --benzopyrano[9,9a,1- --"
    Line 33, "3     (2'-benzthiazolyl)" should read
    --3-(2'-benzthiazolyl)--.
    Line 34, "thylaminocoumarin," should read
    --thyl-aminocoumarin,--.
    Line 35, "10-acetyljulolidino9,10-c]" should read
    --10-acetyljulolidino[9,10-c]--.

COLUMN 16

TABLE 3, "carbonylbiscoumarin)" should read
    --carbonylbiscoumarin--.

UNITED STATES PATENT AND TRADEMARK OFFICE
CERTIFICATE OF CORRECTION

PATENT NO. : 4,948,694
DATED : August 14, 1990
INVENTOR(S) : NORIO OHKUMA, ET AL.

Page 3 of 3

It is certified that error appears in the above-identified patent and that said Letters Patent is hereby corrected as shown below:

COLUMN 17

Line 2, "dium" should read --dium,--.
TABLE 5, "Urethane K.K." should read --Urethane K.K.)--
and "Coumarine" should read --Coumarin--.
Line 56, "THe" should read --The--.

COLUMN 18

Line 1, "$NH_{40}H$" should read --$NH_4OH$--.
Line 5, "gluraraldehyde" should read --glutaraldehyde--.
Line 32, "coumarine" should read --coumarin--.

Signed and Sealed this

Second Day of April, 1991

Attest:

HARRY F. MANBECK, JR.

Attesting Officer

Commissioner of Patents and Trademarks